United States Patent
Choi et al.

(10) Patent No.: US 11,353,900 B2
(45) Date of Patent: Jun. 7, 2022

(54) INTEGRATED CROSS-DOMAIN POWER TRANSFER VOLTAGE REGULATORS

(71) Applicant: INTEL CORPORATION, Santa Clara, CA (US)

(72) Inventors: Beomseok Choi, Chandler, AZ (US); Siddharth Kulasekaran, Tempe, AZ (US); Krishna Bharath, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 819 days.

(21) Appl. No.: 16/020,725

(22) Filed: Jun. 27, 2018

(65) Prior Publication Data

US 2020/0004282 A1   Jan. 2, 2020

(51) Int. Cl.
| | | |
|---|---|---|
| *G05F 1/46* | (2006.01) | |
| *H01L 49/02* | (2006.01) | |
| *H02M 3/158* | (2006.01) | |
| *H01L 25/18* | (2006.01) | |

(52) U.S. Cl.
CPC .............. *G05F 1/465* (2013.01); *H01L 25/18* (2013.01); *H01L 28/10* (2013.01); *H02M 3/1582* (2013.01)

(58) Field of Classification Search
CPC ......... G05F 1/465; H01L 25/18; H01L 28/10; H02M 3/1582
See application file for complete search history.

(56) References Cited

U.S. PATENT DOCUMENTS

| | | | | |
|---|---|---|---|---|
| 8,362,645 | B2 * | 1/2013 | Browning | H02J 4/00 307/52 |
| 8,760,142 | B2 * | 6/2014 | Koerzen | G05F 1/10 323/285 |
| 10,141,844 | B2 * | 11/2018 | Le | H02M 3/158 |
| 10,432,088 | B1 * | 10/2019 | Chang | H02M 1/088 |
| 2008/0136397 | A1 * | 6/2008 | Gunther | G06F 1/3203 323/299 |
| 2012/0329509 | A1 * | 12/2012 | Ravichandran | H04W 52/0274 455/522 |
| 2014/0070876 | A1 * | 3/2014 | Paillet | G05F 1/56 327/538 |
| 2015/0022173 | A1 * | 1/2015 | Le | H02M 3/00 323/282 |
| 2015/0177823 | A1 * | 6/2015 | Maiyuran | G06F 1/3243 713/320 |
| 2016/0179173 | A1 * | 6/2016 | Eastep | G06F 1/3234 713/320 |
| 2017/0060205 | A1 * | 3/2017 | Bharath | H02M 3/158 |
| 2019/0043538 | A1 * | 2/2019 | Hollis | G11C 11/4074 |
| 2019/0393786 | A1 * | 12/2019 | Chang | H02M 3/1584 |

* cited by examiner

*Primary Examiner* — Rafael O De Leon Domenech
(74) *Attorney, Agent, or Firm* — Essential Patents Group, LLP.

(57) ABSTRACT

An apparatus is provided, where the apparatus includes a first domain including first one or more circuitries, and a second domain including second one or more circuitries. The apparatus may further include a first voltage regulator (VR) to supply power to the first domain from a power bus, a second VR to supply power to the second domain from the power bus, and a third VR coupled between the first and second domains. The third VR may at least one of: transmit power to at least one of the first or second domains, or receive power from at least one of the first or second domains.

19 Claims, 11 Drawing Sheets

INTEGRATED CROSS-DOMAIN POWER TRANSFER VOLTAGE REGULATORS

BACKGROUND

Semiconductor packages may include multiple voltage regulated domains for efficient power managements. A voltage regulator (VR) for a domain may be designed to handle a maximum power of the domain. Hence, resources such as traces, plane, bumps, passives, and/or switches within the semiconductor package related to the VR may be enlarged to handle the maximum power of the domain.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
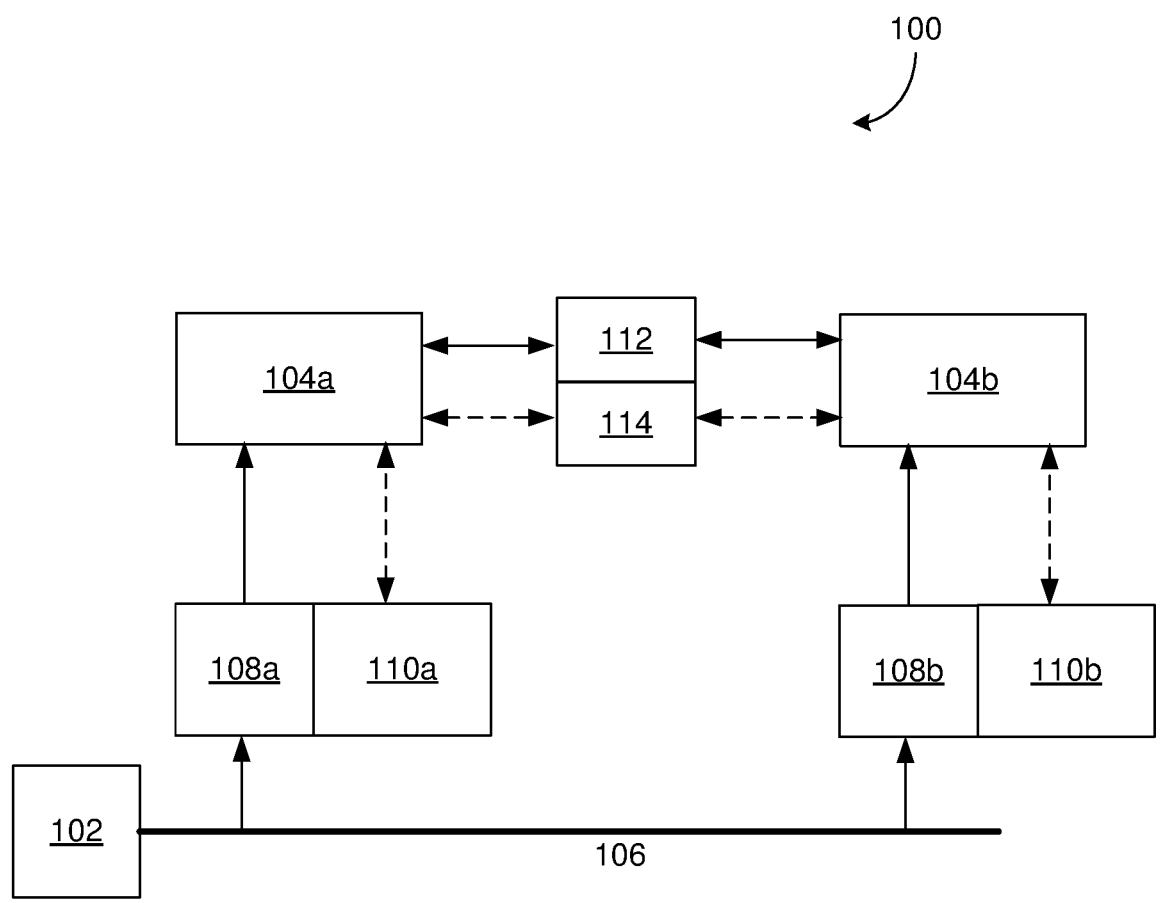
FIG. 1 schematically illustrates a system including two voltage domains, where two VRs are to respectively supply power to the two domains, and where a cross-domain VR is to selectively transmit power between the two domains, according to some embodiments.

A system may include multiple voltage regulated domains, where individual domains may include corresponding one or more circuitries. A domain VR dedicated for a domain may supply power to the domain from a power bus. A domain may consume a regular range of power for most of the time the domain is operational. Also, for relatively small and intermittent time periods, a domain may operate at higher frequency and/or higher voltage (e.g., during a turbo boost mode of operation, during a high-power mode of operation, etc.), when the domain may consume peak or maximum power, where the peak power may be higher than the regular range of power consumption.

However, not all the domains may operate at peak power at the same time. For example, in a server system, not all servers may operate at peak power at the same time. Assume a first domain and a second domain, where a first domain VR may supply power to the first domain and a second domain VR may supply power to the second domain. In an example, the first domain may operate at a first peak power for a first time-period, and the second domain may operate at a second peak power for a second time-period, where the first and second time-periods may be non-overlapping. Due to the non-overlapping of the first and second time-periods, a combined peak power consumed by the combination of first and second domains over time may be less than the sum of the first and second peak powers. Accordingly, in some embodiments, the first and second domain VRs need not be rated for the first and second peak powers, respectively—rather, the first and second domain VRs, in combination, have to be able to supply at least the combined peak power.

In an example and as discussed herein later in further detail, a domain VR may be able to supply power during a regular operation of the domain. However, during peak power operation of the domain, the domain may receive power from another domain (e.g., if the other domain has excess power to share). Such transfer of power between domains may be via one or more cross-domain VRs. Thus, due to the use of the cross-domain VRs, individual domain VRs may be of relatively lower capacity. Accordingly, in the above discussed example of the first and second domains, the first domain VR may have a power rating that is less than the first peak power, and the second domain VR may have a power rating that is less than the second peak power.

In an example, such cross-domain VRs may allow for smaller peak power design for domain VRs, e.g., thereby providing better utilization and optimization of the domain VRs. Cross-domain VRs may process only partial power, and hence, the cross-domain VRs may have relatively small capacity (e.g., may be designed with less burden on efficiency). In an example, cross-domain VRs may be enabled with different process technology and voltage levels that are different from the domain VRs, and hence, may enable further optimization. Furthermore, cross-domain VR architecture with a common power bus may widen the scope of power sharing. In an example, one or more cross domain VRs may supply power to islanded domains, where an islanded domain may not have its own dedicated domain VR. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrates a system 100 including voltage domains 104a, 104b (also referred to as domains 104a, 104b), where two VRs 108a and 108b are to supply power to the domains 104a, 104b, respectively, and where a cross-domain VR 112 is to selectively transmit power between the domains 104a, 104b, according to some embodiments. Although merely two domains 104a, 104b and two corresponding VRs 108a, 108b are illustrated in FIG. 1, the system 100 may include more than two domains and more than two corresponding VRs.

Elements referred to herein with a common reference label followed by a particular number or alphabet may be collectively referred to by the reference label alone. For example, domains 104a, 104b may be collectively and generally referred to as domains 104 in plural, and domain 104 in singular. Similarly, VRs 108a, 108b may be collectively and generally referred to as VRs 108 in plural, and VR 108 in singular.

In some embodiments, a domain 104 may include one or more circuitries, such as a processor, a memory, a cache, a graphic processing unit (GPU), a central processing unit (CPU), a processing core, an interconnect network, and/or the like. The domains 104 may be included in a single integrated circuit die, in an example. For example, in a die including multiple processing cores, a first one or more domains 104 may include a corresponding first processing core, a second one or more domains 104 may include a corresponding second processing core, and so on. In another example, in a System on a Chip (SOC) including one or more CPUs and/or one or more GPUs, a domain may include a core of the CPU, another domain may include a core of the GPU, and so on.

In another example, the domains 104 may be included in a single semiconductor package. In such an example, first one or more of the domains 104 may include a first die of the semiconductor package, second one or more of the domains 104 may include a second die of the semiconductor package, and so on.

In some embodiments, circuitries within a domain 104 may operate at a corresponding voltage level (which may change dynamically). Different domains 104 may operate at different corresponding voltage levels, or at a same voltage level. Merely as an example, the domain 104a may operate at voltage Va, and the domain 104b may operate at voltage Vb, where Va and Vb may (or may not) be varied dynamically, and where Va may not be (or may be) equal to Vb.

The VRs 108 may regulate voltage of power supplied to the corresponding domains 104. In an example, a VR 108 may be a Direct Current (DC) to DC (DC-DC) converter, which may regulate a level of DC voltage supplied to a corresponding domain 104. Any appropriate type of VRs 108 may be used, e.g., buck regulator, boost regulator, buck-boost regulator, linear regulator, low-dropout regulator, switching regulator, and/or the like.

In some embodiments, the VRs 108 draw power from a power bus 106. The power bus 106 may be, merely as an example, an IC bus, a package bus, a system bus or a platform bus supplying power to VRs of multiple domains, including the VRs 108a, 108b of domains 104a, 104b, respectively. In some embodiments, the power bus 106 is powered by a system or platform level VR 102. The VR 102 may have higher power rating than individual ones of the VRs 108, 112, as the VR 102 may supply input power for multiple VRs 108, 112.

In some embodiments, the system 100 further includes the cross-domain VR (also referred to as X-VR) 112. The X-VR 112 is to selectively transmit power between the domains 104a, 104b. For example, the X-VR 112 may supply power from the domain 104a to the domain 104b, and/or from the domain 104b to the domain 104a, based on a power need and/or excess power capacity of individual domains. Thus, the X-VR 112 may be a bi-directional VR that may selectively transmit power in any direction (e.g., from domain 104a to domain 104b, and/or from domain 104b to domain 104a). A bi-directional DC-DC power converter may be used as the X-VR 112.

To distinguish the VRs 108a, 108b from the cross-VR 112, the VRs 108a, 108b are also referred to as domain VRs. For example, the domain VR 108a supplies power to domain 104a (and may opportunistically supply power to domain 104b via the X-VR 112), and the domain VR 108b supplies power to domain 104b (and may opportunistically supply power to domain 104a via the X-VR 112).

As illustrated in FIG. 1, the X-VR 112 may not directly receive power from the power bus 106 (e.g., the X-VR 112 may not be directly coupled to the power bus 106). Rather, the X-VR 112 may receive power from the power bus 106 via the VR 108a and the domain 104a, and/or via the VR 108b and the domain 104b.

In some embodiments, the VRs 108a, 108b, 112 may be associated with corresponding Power Manager (PM) circuitries 110a, 110b, 114, respectively. A PM circuitry may, among other things, control operation of the corresponding VR. For example, a PM circuitry may communicate with a corresponding domain (e.g., to exchange control information, symbolically illustrated using dotted lines) to determine a desired voltage output of a corresponding VR, and operate the VR to output the voltage at the desired voltage level.

For example, the PM circuitry 114 may communicate with the domains 104a, 104b (e.g., to exchange control information, which are illustrated using dotted lines). Based on such communication, the PM circuitry 114 may determine whether the VR 112 is to transfer power from the domain 104b to the domain 104a, or from the domain 104a to the domain 104b, and the PM circuitry 114 may also determine a desired output voltage level of the VR 112. The PM circuitry 114 may facilitate the operation of the VR 112, based on such determinations.

In a conventional system that has multiple domains and has corresponding multiple VRs (e.g., that does not include a cross-domain VR), a VR has to have sufficient power rating to handle a maximum or peak power demand of the corresponding domain. For example, if the X-VR 112 was absent from the system 100, the domains 104a and 104b would have been isolated from each other from operational power perspective—in such a scenario, the VR 108a would have to be rated sufficiently to meet a peak power demand of the domain 104a, and the VR 108b would have to be rated sufficiently to meet a peak power demand of the domain 104b.

In some examples, the domains 104a, 104b may not operate at peak power at the same time. For example, assume that the domain 104a operates at a maximum or peak power state for a first time period and the domain 104b operates at a maximum or peak power state for a second time period. In an example, the first and second time periods may be non-overlapping. In some embodiments, the VR 108a has less power rating than a peak demand of the domain 104a, and the VR 108b has less power rating than a peak demand of the domain 104b. However, in combination, the VRs 108a and 108b can meet the peak demand of the domain 104a, and can also meet the peak demand of the domain 104b. Thus, in combination, the VRs 108a and 108b can meet the peak demand of the combination of the domains 104a, 104b at any time. The X-VR 112 may be used to opportunistically transfer power between the domains 104a, 104b, so that the peak power demand of individual domains can be supplied by a combination of the VRs 108a, 108b.

In an example, assume peak power requirement of each of the domains 104a, 104b may be 50 Watt (W), but the combined peak power demand of the domains 104a, 104b does not exceed 70 W. In such an example, each VR 108a, 108b may be designed to only handle up to 35 W, instead of 50 W each. If domain 108a demands 50 W while domain 104b demands 20 W (e.g., during a peak power period of the domain 108a), the VR 108a and the VR 108b may both operate to support a combination of 70 W. Excess power supplied to domain 104b, which is 15 W, may be rerouted via the X-VR 112 to the domain 104a, such that the power demand of both the domains are satisfied by the combination of the domain VRs 108a, 108b.

Thus, the embodiments of FIG. 1 may increase resource utilization for the VRs 108, as in the system 100, the domains 104 may not operate at peak power at the same time. The bi-directional power stage (e.g., the X-VR 112) connected between the domains 104a, 104b may reroute unused power resources, when needed.

Figure 2A:
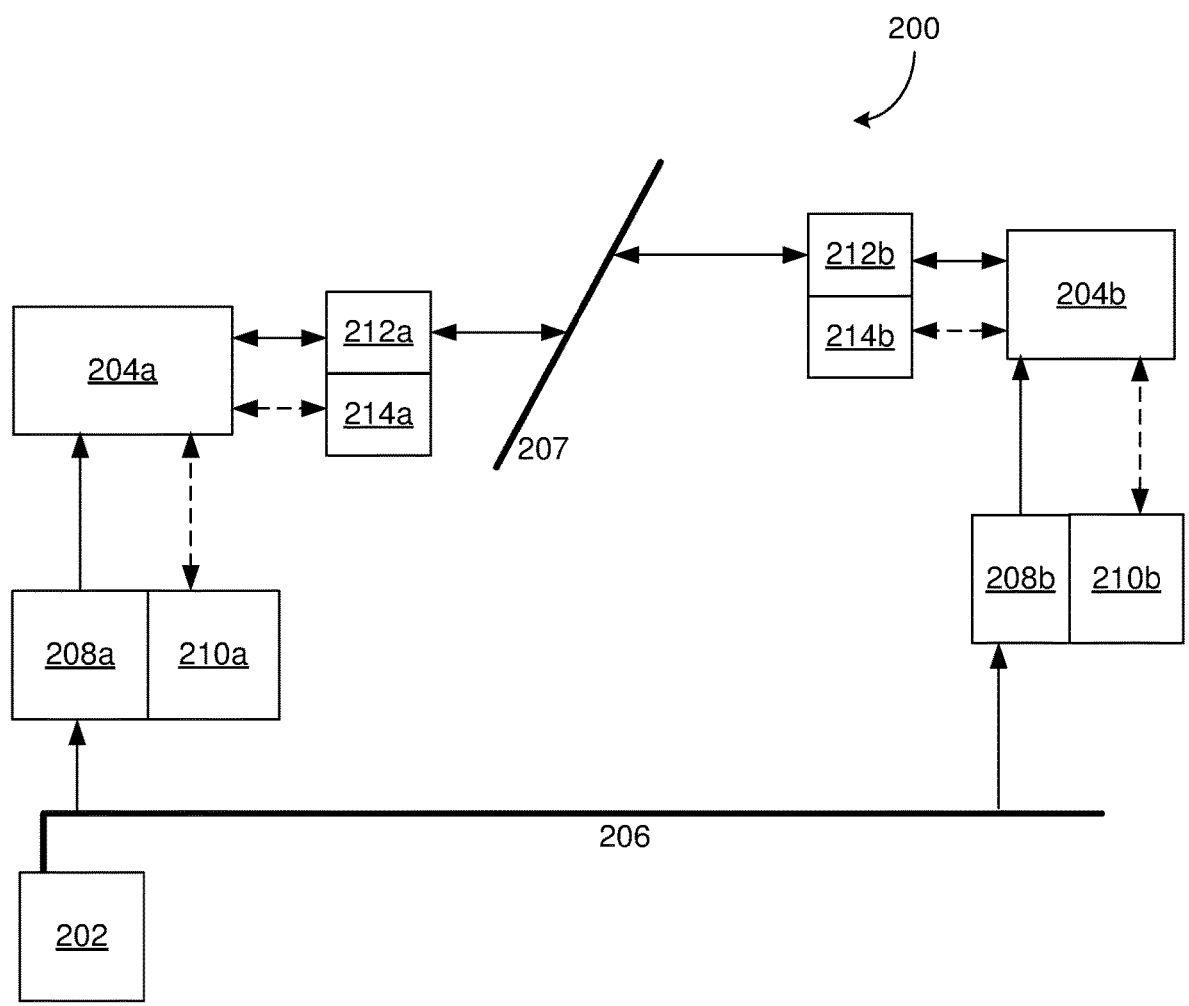
FIG. 2A schematically illustrates a system including two voltage domains, where two domain VRs are to respectively supply power to the two domains, and where two cross-domain VRs are to selectively transmit power between the two domains and a common power bus, according to some embodiments.

FIG. 2A schematically illustrate a system 200 including voltage domains 204a, 204b (also referred to as domains 204a, 204b), where two domain VRs 208a and 208b are to supply power to the domains 204a, 204b, respectively, and where two cross-domain VRs 212a and 212b are to selectively transmit power between the domains 204a, 204b and a common power bus 207, according to some embodiments. The system 200 of FIG. 2A is at least in part similar to the system 100 of FIG. 1. For example, similar to the domains 104a, 104b of the system 100, the system 200 includes the domains 204a, 204b. Similar to the power bus 106, the platform VR 102, and the domain VRs 108a, 108b of the system 100, the system 200 includes the power bus 206, the platform VR 202, and the domain VRs 208a, 208b. Similar to the system 100, individual VRs 208, 212 are coupled to respective PM circuitries 210, 214.

However, unlike the system 100 that included one X-VR 112, the system 200 includes two X-VRs 212a and 212b. The X-VR 212a may transmit power between the domain 204a and a common power bus 207, and the X-VR 212b may transmit power between the domain 204b and the common power bus 207. In some embodiments, the common power bus 207 is a floating bus. However, in some other examples (and although not illustrated in FIG. 2A), the common power bus 207 may be at a voltage level of the power bus 206, and/or the common power bus 207 may be coupled or tied to the power bus 206 (e.g., via another VR, or tied directly).

In some embodiments, the X-VRs 212a, 212b may regulate the power on the common power bus 207 (e.g., regulate power supplied to the common power bus 207, and/or regulate power output from the common power bus 207). Similar to the examples discussed with respect to FIG. 1, in the system 200, the domain VR 208a may not have sufficient rating to satisfy peak power demand of the domain 204a, and the domain VR 208b may not have sufficient rating to satisfy peak power demand of the domain 204b. However, the combined rating of the VRs 204a, 204b may be sufficient to meet the peak demand of the domain 204a, and also sufficient to meet the peak demand of the domain 204b. As the peak demand in the domain 204a and the peak demand of the domain 204b may not occur simultaneously, the VRs 208a, 208b may, in combination, meet the peak demand of the overall system 200. Thus, the combined rating of the VRs 204a, 204b may be sufficient to meet the combined peak demand of a combination of the domains 204a, 204b. Such demand may be met by selectively transmitting power between the domains 204a and 204b (e.g., either from domain 204a to domain 204b, or from domain 204b to domain 204a, based on power need of individual domains), via the X-VRs 212a, 212b and the common power bus 207.

There are several technical benefits of the system 200. For example, the system 200 allows wider sharing of excess power for better system efficiency. For embodiments where individual X-VRs supply power to a floating common power bus 207, this results in decoupled power management. The bus voltage of the common power bus 207 may be flexible, and may be same or different from the operating voltages of either of the domains 204a, 204b. The system 200 may provide better thermal management, e.g., to avoid VR traces overheating at localized hotspots. When the common power bus 207 is connected to the whole system, this architecture may merely need a sum of the domain VRs' power to be the total power dissipation (TDP) limited peak power of the whole system.

Figure 2B:
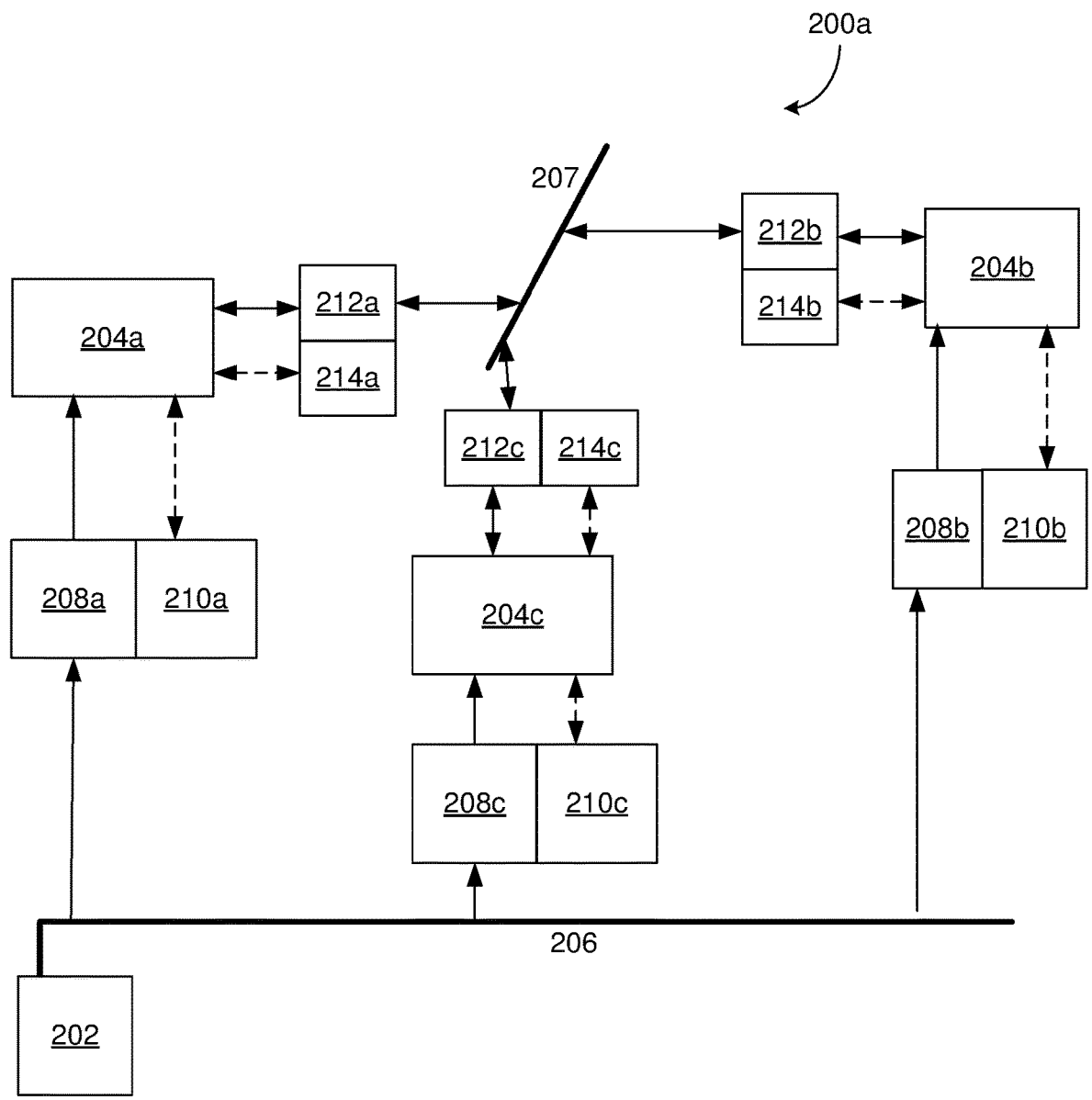
FIG. 2B schematically illustrates a system including three voltage domains, where three domain VRs are to respectively supply power to the three domains, and where three cross-domain VRs are to selectively transmit power between the domains and a common power bus, according to some embodiments.

FIG. 2B schematically illustrates a system 200a including voltage domains 204a, 204b, 204c (also referred to as domains 204a, 204b, 204c), where three domain VRs 208a, 208b, 208c are to supply power to the domains 204a, 204b, 204c, respectively, and where three cross-domain VRs 212a, 212b, 212c are to selectively transmit power between the domains 204a, 204b, 204c and a common power bus 207, according to some embodiments. The system 200a of FIG. 2B is at least in part similar to the system 200 of FIG. 2A, except that the system 200a has an additional domain 204c and corresponding VRs 208c and 212c.

Figure 2C:
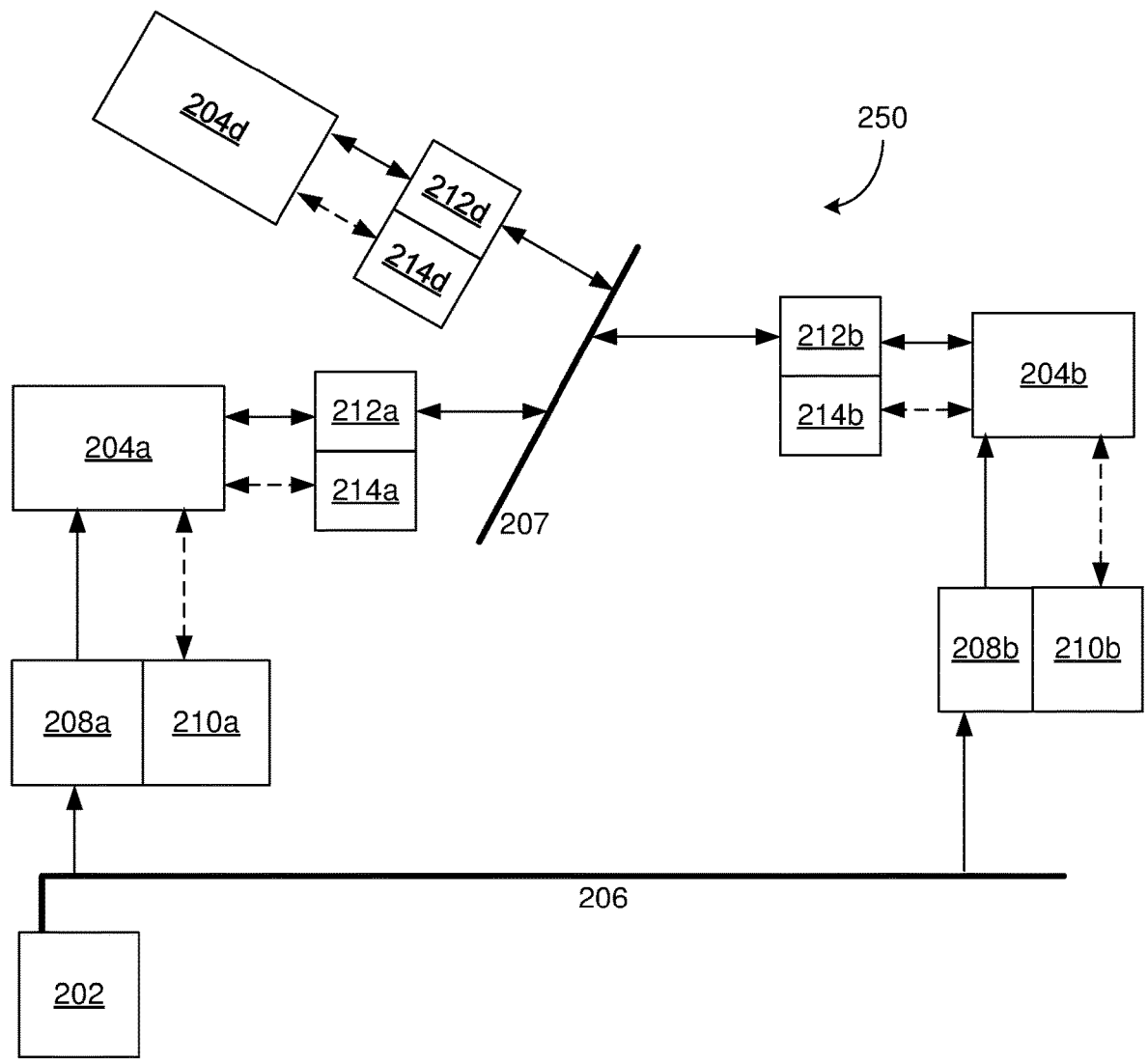
FIG. 2C schematically illustrates a system including three voltage domains, where two domain VRs are to respectively supply power to two domains, where two cross-domain VRs are to selectively transmit power between the two domains and a common power bus, and where a cross-domain VR is to supply power to a third domain from the common power bus, according to some embodiments.

FIG. 2C schematically illustrates a system 250 including voltage domains 204a, 204b, 204d (also referred to as domains 204a, 204b, 204d), where two domain VRs 208a and 208b are to supply power to the domains 204a, 204b, respectively, where two cross-domain VRs 212a and 212b are to selectively transmit power between the domains 204a, 204b and a common power bus 207, and where a cross-domain VR 212d is to supply power to the domain 204d from the common power bus 207, according to some embodiments.

The system 250 of FIG. 2C is at least in part similar to the system 200 of FIG. 2A. However, unlike the system 200, in the system 250 the domain 204d may be coupled to the common power bus 207 via the X-VR 212d. In some embodiments, the domain 204d receives power from the power bus 206 via one of the X-VRs 212a, 212b, and via the common power bus 207. The domain 204d may not receive power directly from the power bus 206 (e.g., by bypassing the X-VRs 212a, 212b). In the system 250, the domain VRs 208a, 208b may have combined capacity to meet the regular power demand of the domains 204a, 204b, 204d, and also to meet a combined peak power demand of the combination of the domains 204.

Figure 3A:
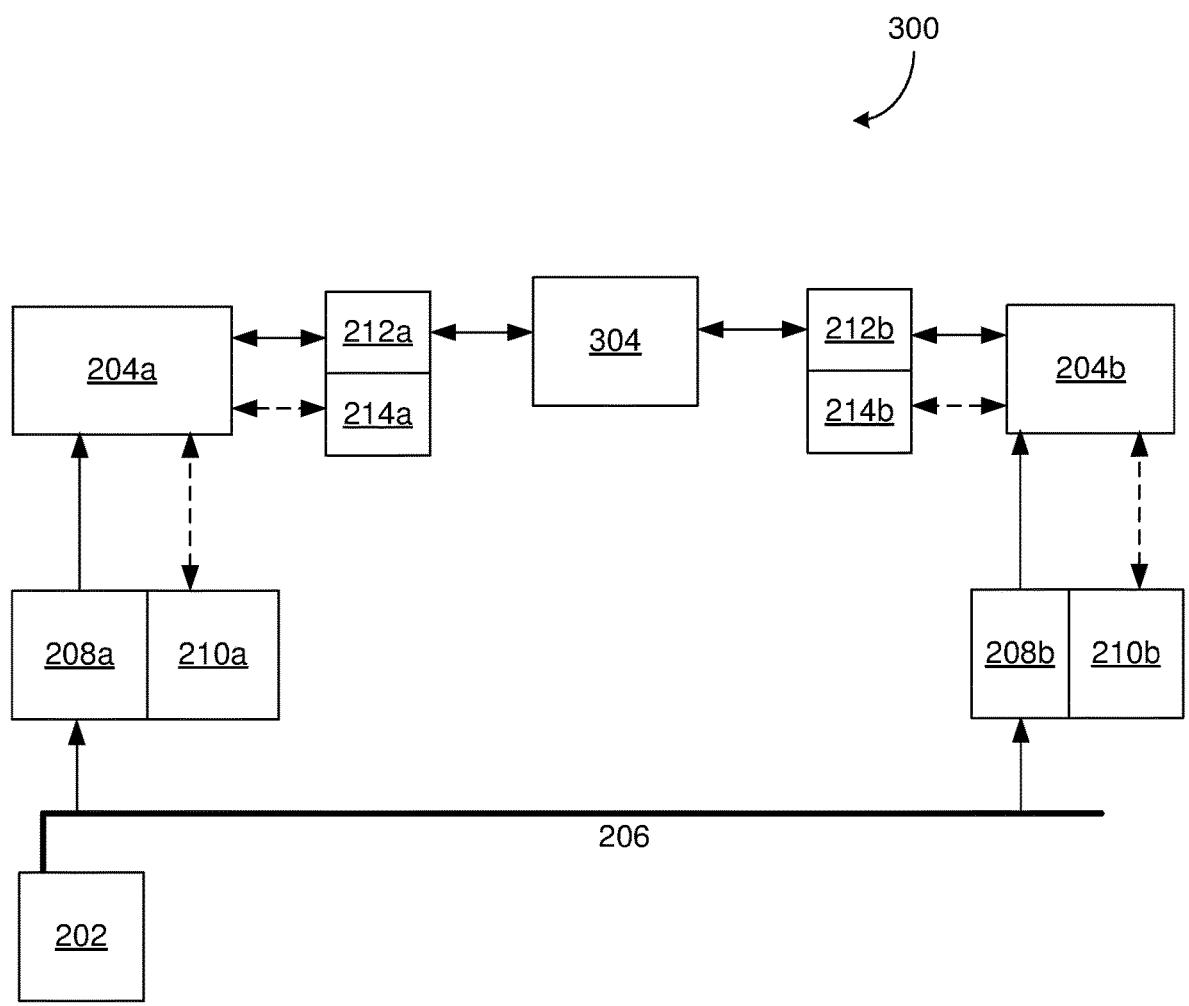
FIG. 3A schematically illustrates a system including three voltage domains, where two domain VRs are to respectively supply power to two domains, and where two cross-domain VRs are to selectively transmit power between the two domains and a third domain, according to some embodiments.

FIG. 3A schematically illustrates a system 300 including voltage domains 204a, 204b, 304 (also referred to as domains 204a, 204b, 304), where two domain VRs 208a and 208b are to supply power to the domains 204a, 204b, respectively, and where two cross-domain VRs 212a and 212b are to selectively transmit power between the domains 204a, 204b and the domain 304, according to some embodiments.

The system 300 of FIG. 3A is at least in part similar to the system 200 of FIG. 2A, and similar components in these two figures are labelled using similar labels. However, unlike the system 200, in the system 300 the common power bus 207 is replaced by a third domain 304.

In some embodiments, the domain 304 receives power from the power bus 206 via one or both of the X-VRs 212a, 212b. Thus, the domain 304 may receive power from the power bus 206 via the domain 204a and/or domain 204b. The domain 304 may not receive power directly from the power bus 206 (e.g., by bypassing the X-VRs 212a, 212b). In the system 300, the domain VRs 208a, 208b may have combined capacity to meet the regular power demand of the domains 204a, 204b, 304, and also to meet a combined peak power demand of a combination of the domains 204a, 204b, 304 of the system 300.

As discussed herein above, in the system 300, power demand of the domain 304 may be satisfied by one or both of the X-VRs 212a, 212b. Also, for example, a peak demand in the domain 204a may be satisfied at least partly by the domain VR 208a, and also at least partly by the domain VR 208b (e.g., via the domain 204b, X-VR 212b, domain 304, and X-VR 212a). Similarly, a peak demand in the domain 204b may be satisfied at least partly by the domain VR 208b, and also at least partly by the domain VR 208a (e.g., via the domain 204a, X-VR 212a, domain 304, and X-VR 212b).

In an example, three domains 204a, 204b, 304 of the system 300 are powered using merely two domain VRs 208a, 208b, thereby reducing a number of domain VRs in the system 300. For example, domain 304 does not have a dedicated domain VR. Such a reduction in the number of domain VRs in the system 300 may be achieved without any additional bus routing. The architecture of system 300 may be used for application domains where a common domain (e.g., domain 304) is powered when at least one of multiple primary domains (e.g., primary domains 204a, 204b) is active. Example systems that may employ the architecture of system 300 may be multi-core domains with ring or mesh intra-core communication domains, common cache, etc.

Figure 3B:
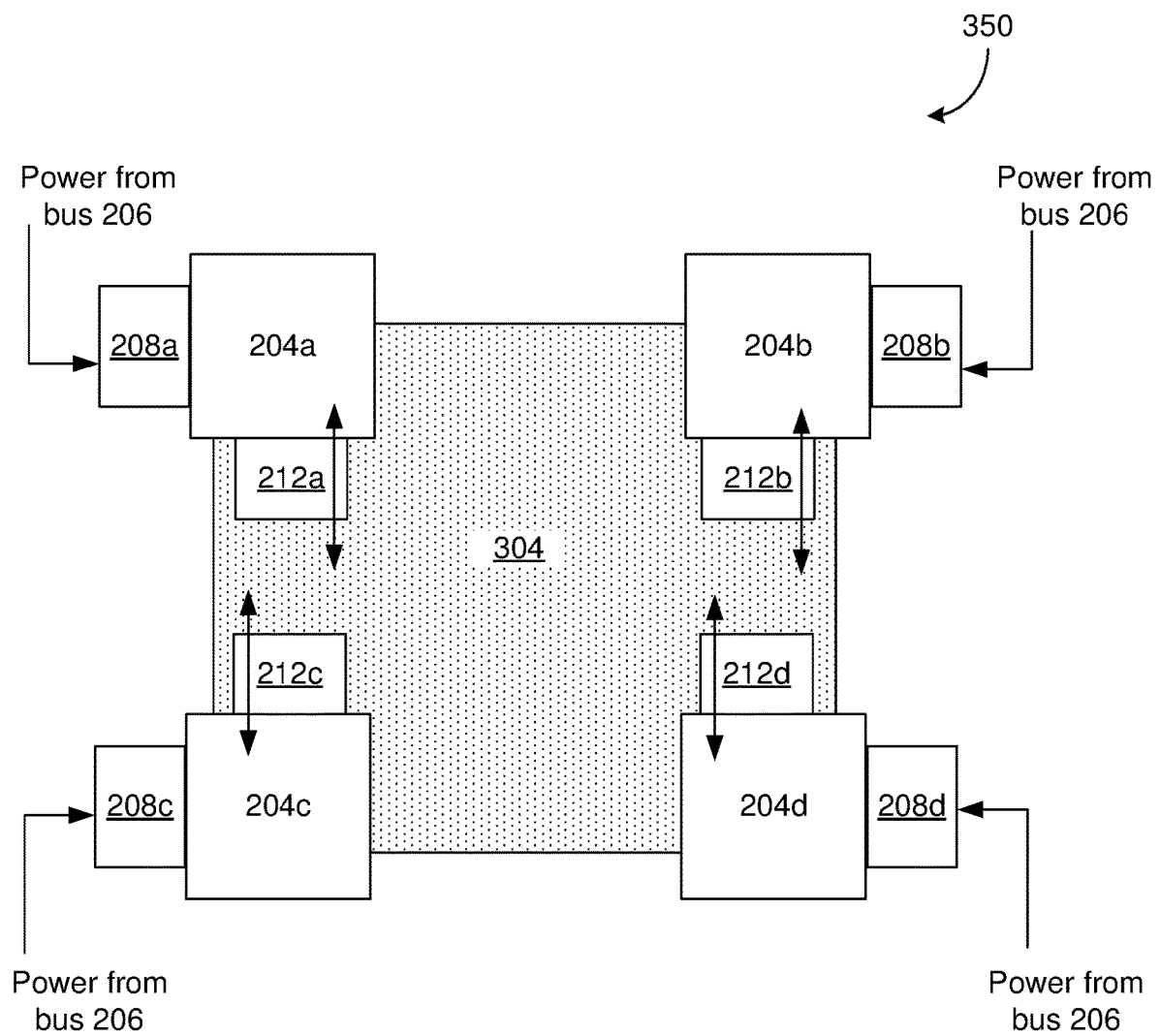
FIG. 3B illustrates a system, which is an example implementation of the system of FIG. 3A, according to some embodiments.

FIG. 3B illustrates a system 350, which is an example implementation of the system 300 of FIG. 3A, according to some embodiments. For example, in FIG. 3B, four primary domains 204a, 204b, 204c, 204d and a common domain 304 are illustrated. Merely as an example, individual ones of the primary domains 204a, 204b, 204c, 204d may be a corresponding CPU, such that the primary domains 204a, 204b, 204c, 204d form a CPU cluster. The common domain 304 may be a ring or mesh architecture that interconnects the CPUs.

The primary domains 204a, 204b, 204c, 204d are powered by respective domain VRs 208a, 208b, 208c, 208d (the PM circuitries of various VRs are not illustrated). When all the primary domains 204a, 204b, 204c, 204d are powered down (e.g., in a low power state, an off state, etc.), the common domain 304 may not need to be powered on. Accordingly, the common domain 304 may not have a dedicated domain VR. In an example, X-VRs 212a, 212b, 212c, 212d may respectively interconnect primary domains 204a, 204b, 204c, 204d with the common domain 304. The common domain 304 may be powered by one or more of the X-VRs 212a, 212b, 212c, 212d (e.g., the common domain 304 may be powered when at least one of the primary domains 204a, 204b, 204c, 204d is powered).

Also, in case a peak power demand of a first primary domain exceeds the capacity of a corresponding first domain VR, power from one or more other domains may be supplied to the first domain via one or more X-VRs and via the common domain 304. For example, when peak power demand of domain 204a exceeds the capacity of the domain VR 208a, power from domain 204b may be supplied to the domain 204a via X-VRs 212b, 212a, and via the common domain 304.

Figure 4:
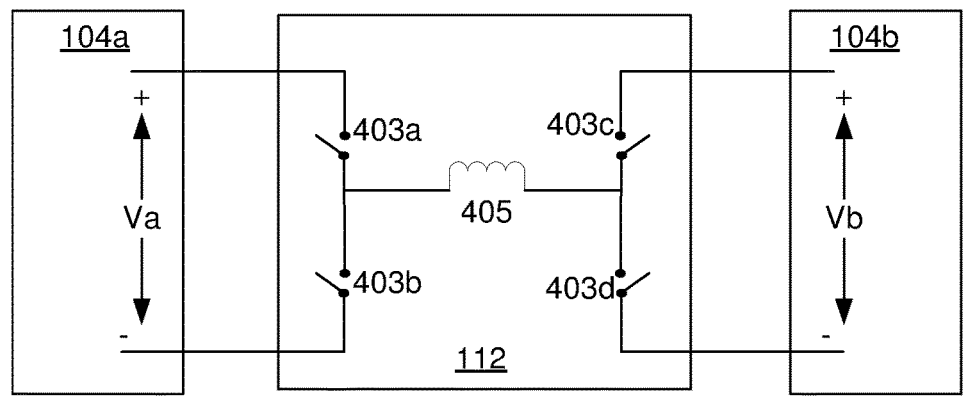
FIG. 4 illustrates an example implementation of a cross-domain VR, according to some embodiments.

FIG. 4 illustrates an example implementation of the cross-domain VR 112 of FIG. 1, according to some embodiments. The X-VR 112 receives or generates a voltage Va in the domain 104a, and receives or generates a voltage Vb in the domain 104b. As previously discussed, herein, the X-VR 112 is a bi-directional DC-DC converter, e.g., may receive voltage Va from domain 104a and may transmit voltage Vb to domain 104b, or may receive voltage Vb from domain 104b and may transmit voltage Va to domain 104a.

In some embodiments, the X-VR 112 is implemented as a buck-boost VR, where the X-VR 112 may act as a buck converter or a boost converter, e.g., may step down or step up the received voltage. The X-VR 112 may operate in a voltage regulation mode, or in a current regulation mode.

In the example implementation of FIG. 4, the X-VR 112 includes an inductor 405. The inductor 405 is coupled to a positive node of domain 104a via switch 403a, coupled to a negative node of domain 104a via switch 403b, coupled to a positive node of domain 104b via switch 403c, and coupled to a negative node of domain 104b via switch 403d. The switches 403 may be implemented using, for example, appropriate transistors. The X-VR 112 may include appropriate feedback mechanism that are generally included in a bi-directional DC-DC converter. Although FIG. 4 illustrates an example implementation of the X-VR 112, any appropriate implementation of a bi-directional DC-DC converter may be used.

Figure 5:
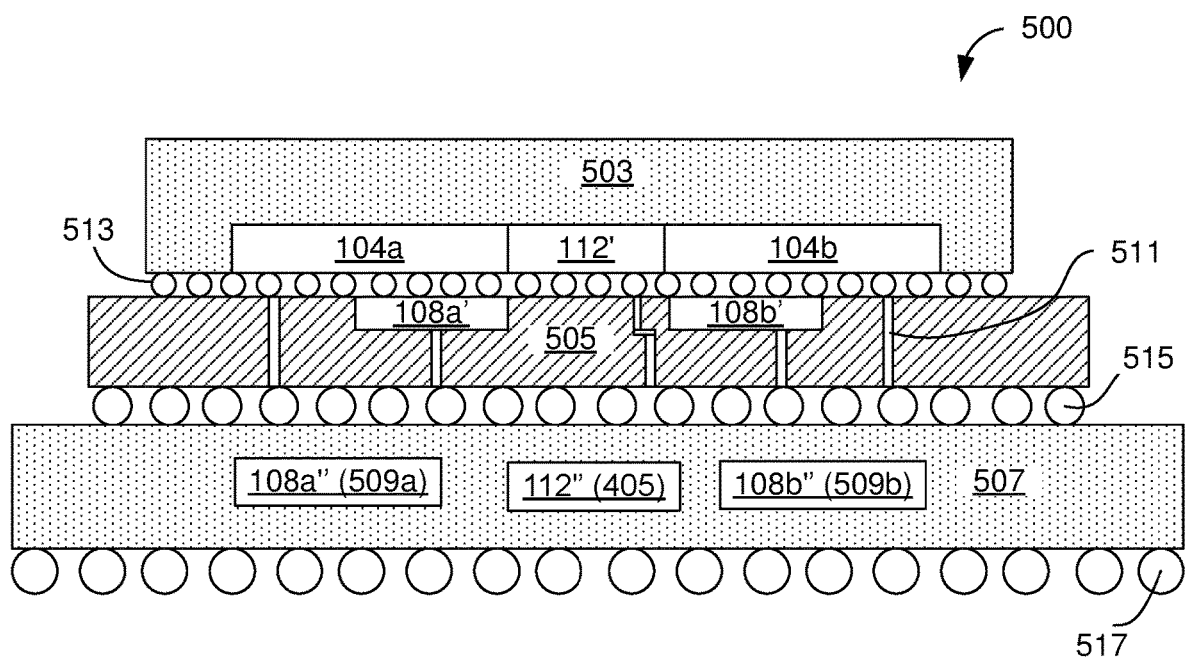
FIG. 5 illustrates a cross-sectional view of a semiconductor package that incorporates various components of the system of FIG. 1, according to some embodiments.

FIG. 5 illustrates a cross-sectional view of a semiconductor package 500 that incorporates various components of the system 100 of FIG. 1, according to some embodiments. In some embodiments, the package 500 includes a substrate 507, and dies 505 and 503 stacked on the substrate 507. For example, the die 505 may be on the substrate 507, and the die 503 may be on the die 505. Although merely two stacked dies 503, 505 are illustrated in FIG. 5, the package 500 may include any number of dies arranged in any appropriate configuration.

Referring to FIGS. 1, 4, and 5, in an example, the top die 503 may include the domains 104a, 104b. In an example and as discussed with respect to FIG. 4, the X-VR 112 may include at least a plurality of switches (e.g., switches 403a, . . . , 403d), and one or more inductors (e.g., inductor 405).

In some embodiments, at least a first part of the X-VR 112 is included in the top die 503, where the first part of the X-VR 112 included in the top die 503 is labelled as 112' in FIG. 5. The first part 112' of the X-VR 112 included in the top die 503 may comprise the switches (e.g., switches 403a, . . . , 403d) of the X-VR 112.

In some embodiments, at least a second part of the X-VR 112 is included in the substrate 507, where the second part of the X-VR 112 included in the substrate 507 is labelled as 112" in FIG. 5. The second part 112" of the VR 112 included in the substrate 507 may comprise the one or more inductors (e.g., inductor 405) of the VR 112. For example, the inductor 405 may be on, or at least in part embedded within, the substrate 507. In an example, the inductor 405 may be on package traces that are on or within the substrate 507. In another example, the inductor 405 may be air core inductor (ACI) on the substrate 507.

In an example, the VR 108a may include at least a plurality of switches and one or more inductors 509a. In some embodiments, at least a first part of the VR 108a is included in the bottom die 505, where the first part of the VR 108a included in the die 505 is labelled as 108a' in FIG. 5. The first part 108a' of the VR 108a included in the die 505 may comprise the switches of the VR 108a. In some embodiments, at least a second part of the VR 108a is included in the substrate 507, where the second part of the VR 108a included in the substrate 507 is labelled as 108a" in FIG. 5. The second part 108a" of the VR 108a included in the substrate 507 may comprise the one or more inductors 509a of the VR 108a. For example, the one or more inductors 509a may be on, or at least in part embedded within, the substrate 507. In an example, the inductor 509a may be on package traces that are on or within the substrate 507. In another example, the inductor 509a may be air core inductor on the substrate 507.

In an example, the VR 108b may include at least a plurality of switches and one or more inductors 509b. In some embodiments, at least a first part of the VR 108b is included in the bottom die 505, where the first part of the VR 108b included in the die 505 is labelled as 108b' in FIG. 5. The first part 108b' of the VR 108b included in the die 505 may comprise the switches of the VR 108b. In some embodiments, at least a second part of the VR 108b is included in the substrate 507, where the second part of the VR 108b included in the substrate 507 is labelled as 108b" in FIG. 5. The second part 108b" of the VR 108b included in the substrate 507 may comprise the one or more inductors 509b of the VR 108a. For example, the one or more inductors 509b may be on, or at least in part embedded within, the substrate 507. In an example, the inductor 509b may be on package traces that are on or within the substrate 507. In another example, the inductor 509b may be air core inductor on the substrate 507.

In some embodiments, the dies 503, 505 are coupled using a plurality of interconnect structures 513. The interconnect structures 513, for example, are bumps, bump pads, metal pillars (e.g., copper pillars), balls formed using metals, alloys, solderable material, or the like. The interconnect structures 513, for example, are solder formed using metals, alloys, solderable material, or the like.

In some embodiments, the die 505 is coupled to the substrate 507 using a plurality of interconnect structures 515. The interconnect structures 515, for example, are bumps, bump pads, metal pillars (e.g., copper pillars), balls formed using metals, alloys, solderable material, or the like. The interconnect structures 515, for example, are solder formed using metals, alloys, solderable material, or the like.

In some embodiments, a plurality of interconnect structures 517 are attached to the substrate 507, e.g., for connection to an external component (e.g., a motherboard, a printed circuit board, etc.). The interconnect structures 517, for example, are bumps, bump pads, metal pillars (e.g., copper pillars), balls formed using metals, alloys, solderable material, or the like. The interconnect structures 517, for example, are solder formed using metals, alloys, solderable material, or the like.

In some embodiments, the die 505 includes a plurality of through substrate vias (TSVs), e.g., to route signals of the die 503 to the substrate 507. Although FIG. 5 illustrates the substrate 507 including the inductors 405, 509a, 509b, in an example, one or more of the inductors 405, 509a, 509b may be on the die 505 (or on the die 503). For example, one or more of the inductors 405, 509a, 509b may be TSV inductors, e.g., spiral inductors based on TSV technology. For example, one or more of the TSVs 511 of the die 505 may be used for one or more of the inductors 405, 509a, 509b. Similarly, one or more of the inductors 405, 509a, 509b may be included in the die 503 as well. In some embodiments, the platform VR 102 of the system 100 of FIG. 1 may be outside the package 500 of FIG. 5.

Figure 6:
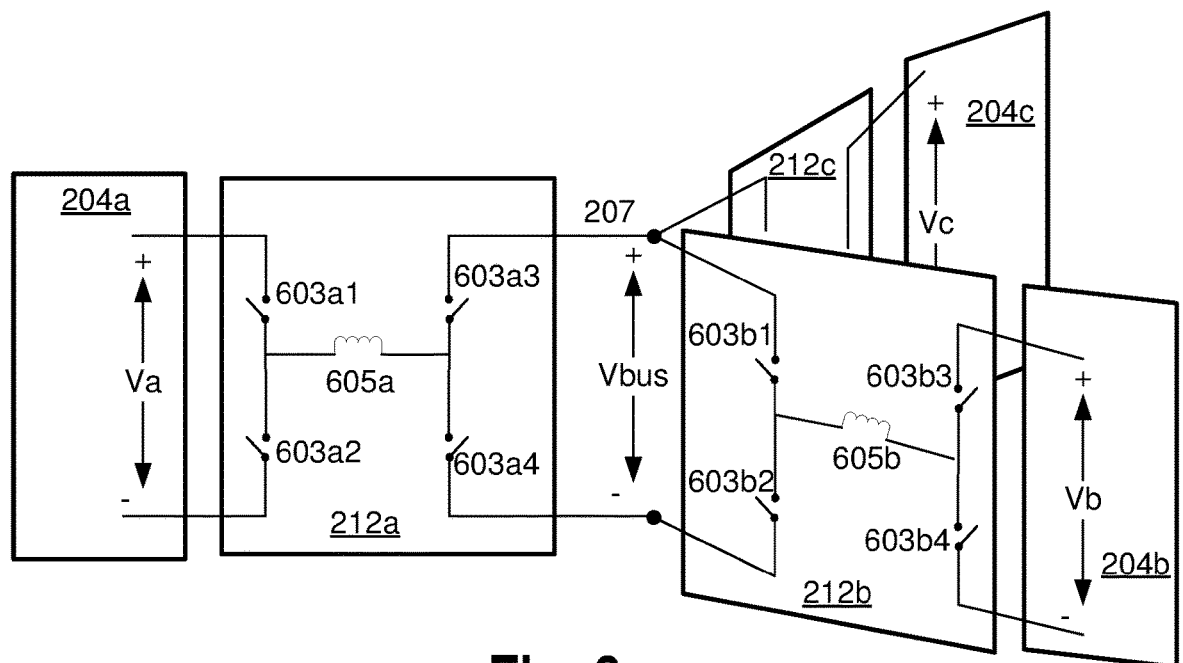
FIG. 6 illustrates an example implementation of the cross-domain VRs of the system of FIG. 2B, according to some embodiments.

FIG. 6 illustrates an example implementation of the cross-domain VRs 212a, 212b, 212c of the system 200a of FIG. 2B, according to some embodiments. Components of individual ones of the X-VRs 212a, 212b, 212c in FIG. 6 may be at least in part similar to the corresponding components of the VR 112 of FIG. 4.

In the example implementation of FIG. 6, the X-VR 212a includes an inductor 605a. The inductor 605a is coupled to a positive node of domain 204a via switch 603a1, coupled to a negative node of domain 204a via switch 603a2, coupled to a positive node of the common bus 207 via switch 603a3, and coupled to a negative node of the common bus 207 via switch 603a4. The switches 603a may be implemented using, for example, appropriate transistors. The X-VR 212a may include appropriate feedback mechanism that are generally included in a bi-directional DC-DC converter. Although FIG. 6 illustrates an example implementation of the X-VR 212a, any appropriate implementation of a bi-directional DC-DC converter may be used. The X-VRs 212b and 212c may be implemented using similar corresponding components (the components of the X-VR 212c are not visible in FIG. 6).

The voltages in the domains 204a, 204b, 204c may be Va, Vb, and Vc, respectively. The voltage of the common bus 207 may be Vbus, which may be similar to, or different from, one or more of the voltages Va, Vb, and Vc. The VR 212a may convert between voltages Va and Vbus, the VR 212b may convert between voltages Vb and Vbus, and the VR 212c may convert between voltages Vc and Vbus.

In some embodiments, the X-VRs 212a, 212b, 212c are implemented as a buck-boost VR, where individual ones of the X-VRs 212 may act as a buck converter or a boost converter, e.g., may step down or step up the received voltage. The X-VRs 212 may operate in a voltage regulation mode, or in a current regulation mode.

Figure 7:
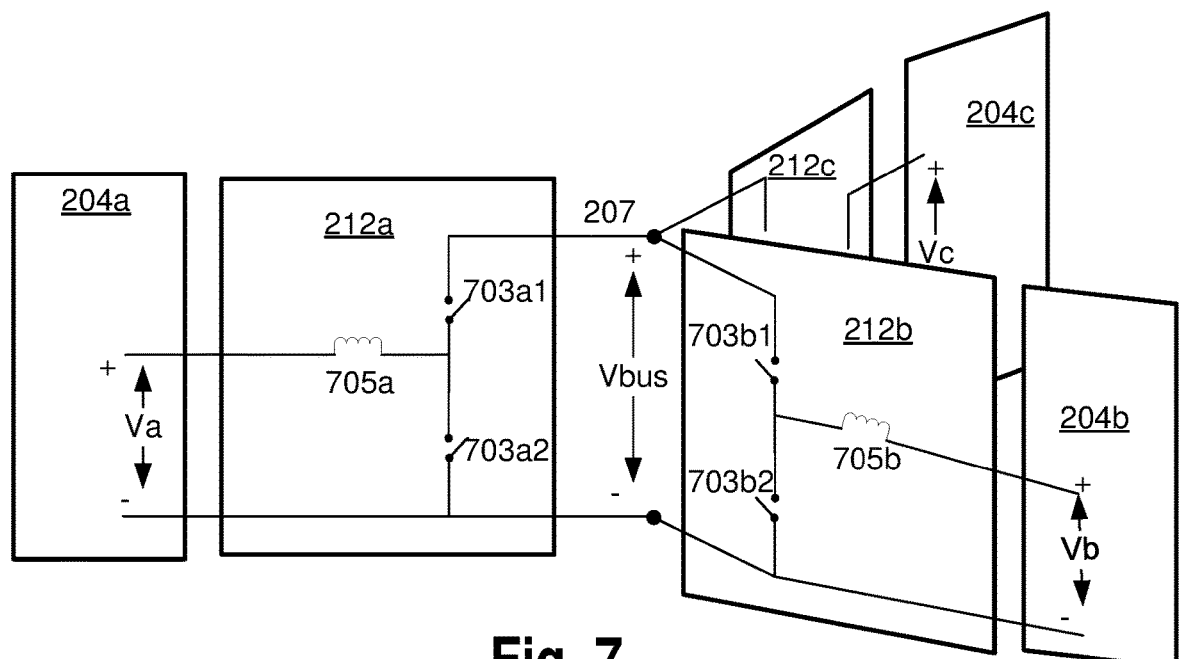
FIG. 7 illustrates another example implementation of the cross-domain VRs of the system of FIG. 2B, according to some embodiments.

FIG. 7 illustrates another example implementation of the cross-domain VRs 212a, 212b, 212c of the system 200a of FIG. 2B, according to some embodiments. In the example implementation of FIG. 7, the X-VR 212a includes an inductor 705a. The inductor 705a is coupled to a positive node of domain 204a, coupled to a negative node of domain 204a via switch 703a2, coupled to a positive node of the common bus 207 via switch 603a1, and coupled to a negative node of the common bus 207 via the switch 703a2. The switches 703a may be implemented using, for example, appropriate transistors. The X-VR 212a may include appropriate feedback mechanism that are generally included in a bi-directional DC-DC converter. Although FIG. 7 illustrates an example implementation of the X-VR 212a, any appropriate implementation of a bi-directional DC-DC converter may be used. The X-VRs 212b and 212c may be implemented using similar corresponding components (the components of the X-VR 212c are not visible in FIG. 7).

In some embodiments, individual ones of the X-VRs 212a, 212b, 212c is implemented as a buck converter or a boost converter, e.g., depending on a direction of flow of power. The voltages in the domains 204a, 204b, 204c may be Va, Vb, and Vc, respectively. The voltage of the common bus 207 may be Vbus, which may be similar to, or different from, one or more of the voltages Va, Vb, and Vc. The VR 212a may convert between voltages Va and Vbus, the VR 212b may convert between voltages Vb and Vbus, and the VR 212c may convert between voltages Vc and Vbus.

Figure 8:
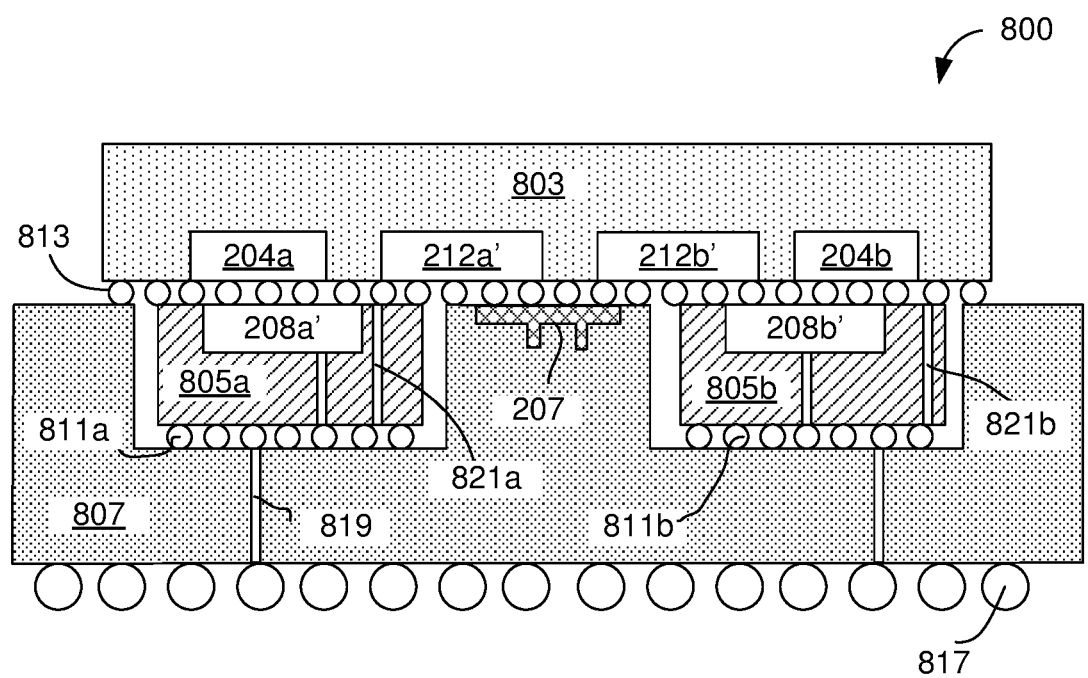
FIG. 8 illustrates a cross-sectional view of a semiconductor package that incorporates various components of the system of FIG. 2A, according to some embodiments.

FIG. 8 illustrates a cross-sectional view of a semiconductor package 800 that incorporates various components of the system 200 of FIG. 2A, according to some embodiments. In some embodiments, the package 800 includes a substrate 807, and dies 805a, 805b, and 803 stacked on the substrate 807.

For example, the substrate 807 may have first and second recessed regions. The die 805a may be at least in part within the first recessed region of the substrate 807, and the die 805b may be at least in part within the second recessed region of the substrate 807. The die 805a may be attached to the substrate 807 via a plurality of interconnect structures 811a, and the die 805b may be attached to the substrate 807 via a plurality of interconnect structures 811b. The die 803 may be on an un-recessed region of the substrate 807, and on the dies 805a, 805b. For example, the die 803 may be attached to top surfaces of the substrate 807 and the dies 805a, 805b via a plurality of interconnect structures 813.

The interconnect structures 811a, 811b, 813, for example, are bumps, bump pads, metal pillars (e.g., copper pillars), balls formed using metals, alloys, solderable material, and/or the like. The interconnect structures 811a, 811b, 813, for example, are solder formed using metals, alloys, solderable material, or the like.

In some embodiments, the package 800 includes a plurality of TSVs 821a in the die 805a, a plurality of TSVs 821b in the die 805b, and a plurality of TSVs 819 in the substrate 807. Although merely three dies 803, 805a, 805b are illustrated in FIG. 8, the package 800 may include any number of dies arranged in any appropriate configuration. Referring to FIGS. 2A and 8, in an example, the top die 803 may include the domains 204a, 204b.

In an example and as discussed with respect to FIGS. 6 and 7, each of the X-VRs 212a, 212b may include at least a plurality of switches (e.g., switches 603 or 703), and one or more inductors (e.g., inductor 605 or 705). In some embodiments, a first part of the X-VR 212a is included in the top die 803, where the first part of the X-VR 212a included in the top die 803 is labelled as 212a' in FIG. 8. The first part 212a' of the VR 212a included in the top die 803 may comprise the switches (e.g., switches 603a or 703a) of the VR 212a. Similarly, in some embodiments, a first part of the X-VR 212b is included in the top die 803, where the first part of the X-VR 212b included in the top die 803 is labelled as 212b' in FIG. 8. The first part 212b' of the VR 212b included in the top die 803 may comprise the switches (e.g., switches 603b or 703b) of the VR 212b.

In some embodiments, a second part of the X-VR 212a comprises one or more inductors (e.g., inductors 605a or 705a of FIGS. 6-7), and a second part of the X-VR 212b comprises one or more inductors (e.g., inductors 605b or 705b of FIGS. 6-7). The inductors of the X-VRs 212a, 212b may be on any appropriate position within the package 800 (although the inductors are not illustrated in FIG. 8). Merely as an example, the inductors of the X-VRs 212a, 212b may be on, or at least in part embedded within, the substrate 807. In an example, the inductors may be on package traces that are on or within the substrate 807. In another example, the inductors may be air core inductors on the substrate 807. In yet another example, the inductors of the X-VRs 212a, 212b may be TSV inductors, e.g., spiral inductors based on TSV technology. For example, one or more of the TSVs 821a, 821b (or TSVs 819) may be used for one or more of the inductors of the X-VRs 212a, 212b.

In an example, each of the VRs 208a, 208b may include at least a plurality of switches and one or more inductors. In some embodiments, a first part of the VR 208a (labelled as 208a') is included in the die 805a, where the first part of the VR 208a includes the switches of the VR 208a. In some embodiments, a first part of the VR 208b (labelled as 208b') is included in the die 805b, where the first part of the VR 208b includes the switches of the VR 208b.

In some embodiments, a second part of each of the VRs 208a, 208b comprises one or more corresponding inductors. The inductors of the VRs 208a, 208b may be on any appropriate position within the package 800 (although the inductors are not illustrated in FIG. 8). Merely as an example, the inductors of the VRs 208a, 208b may be on, or at least in part embedded within, the substrate 807. In an example, the inductors may be on package traces that are on or within the substrate 807. In another example, the inductors may be air core inductors on the substrate 807. In yet another example, the inductors of the VRs 208a, 208b may be TSV inductors, e.g., spiral inductors based on TSV technology. For example, one or more of the TSVs 821a may be used for the inductors of the VRs 208a, and one or more of the TSVs 821b may be used for the inductors of the VRs 208b In the example of FIG. 8, the common bus 207 is included in the substrate 807, where the common bus 207 is coupled to the first parts 212a' and 212b' of the X-VRs 212a, 212b, respectively. In another example, the common bus 207 may be included in the top die 803. In some embodiments, the platform VR 202 of the system 200 of FIG. 2A may be outside the package 800 of FIG. 8.

Figure 9:
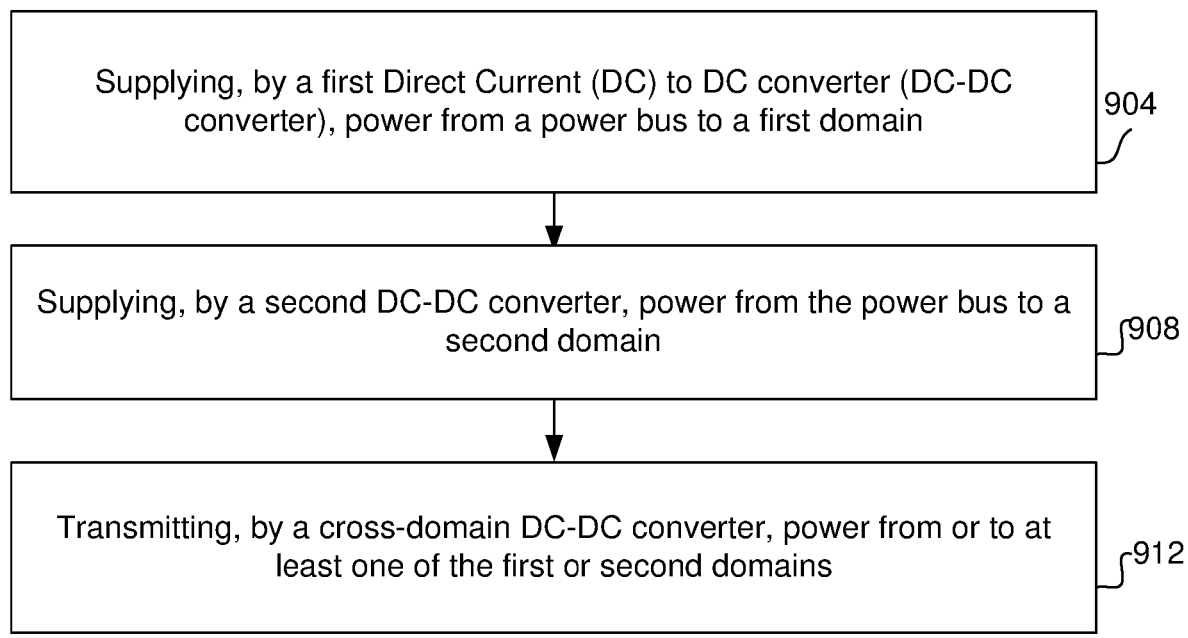
FIG. 9 illustrates a flowchart depicting a method for transferring power between various domains using one or more cross-domain VRs, according to some embodiments.

FIG. 9 illustrates a flowchart depicting a method 900 for transferring power between various domains using one or more cross-domain VRs, according to some embodiments. Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 may be optional in accordance with certain embodiments. The numbering of the blocks presented is for the sake of clarity and is not intended to prescribe an order of operations in which the various blocks must occur.

The method 900 includes, at 904, supplying, by a first DC to DC converter (e.g., VR 108a of FIG. 1, or a domain VR discussed with respect to FIGS. 2-9), power from a power bus (e.g., power bus 106 of FIG. 1, or a power bus discussed with respect to FIGS. 2-9) to a first domain (e.g., domain 104a of FIG. 1, or a domain discussed with respect to FIGS. 2-9). In some embodiments, the first domain includes first one or more circuitries.

The method 900 includes, at 908, supplying, by a second DC-DC converter (e.g., VR 108b of FIG. 1, another domain VR discussed with respect to FIGS. 2-9), power from the power bus to a second domain (e.g., domain 104b of FIG. 1, or another domain discussed with respect to FIGS. 2-9). In some embodiments, the second domain includes second one or more circuitries. The method 900 includes, at 904, transmitting, by a cross-domain DC-DC converter (e.g., X-VR 112 of FIG. 1, another X-VR discussed with respect to FIGS. 2-9), power from or to at least one of the first or second domains.

Figure 10:
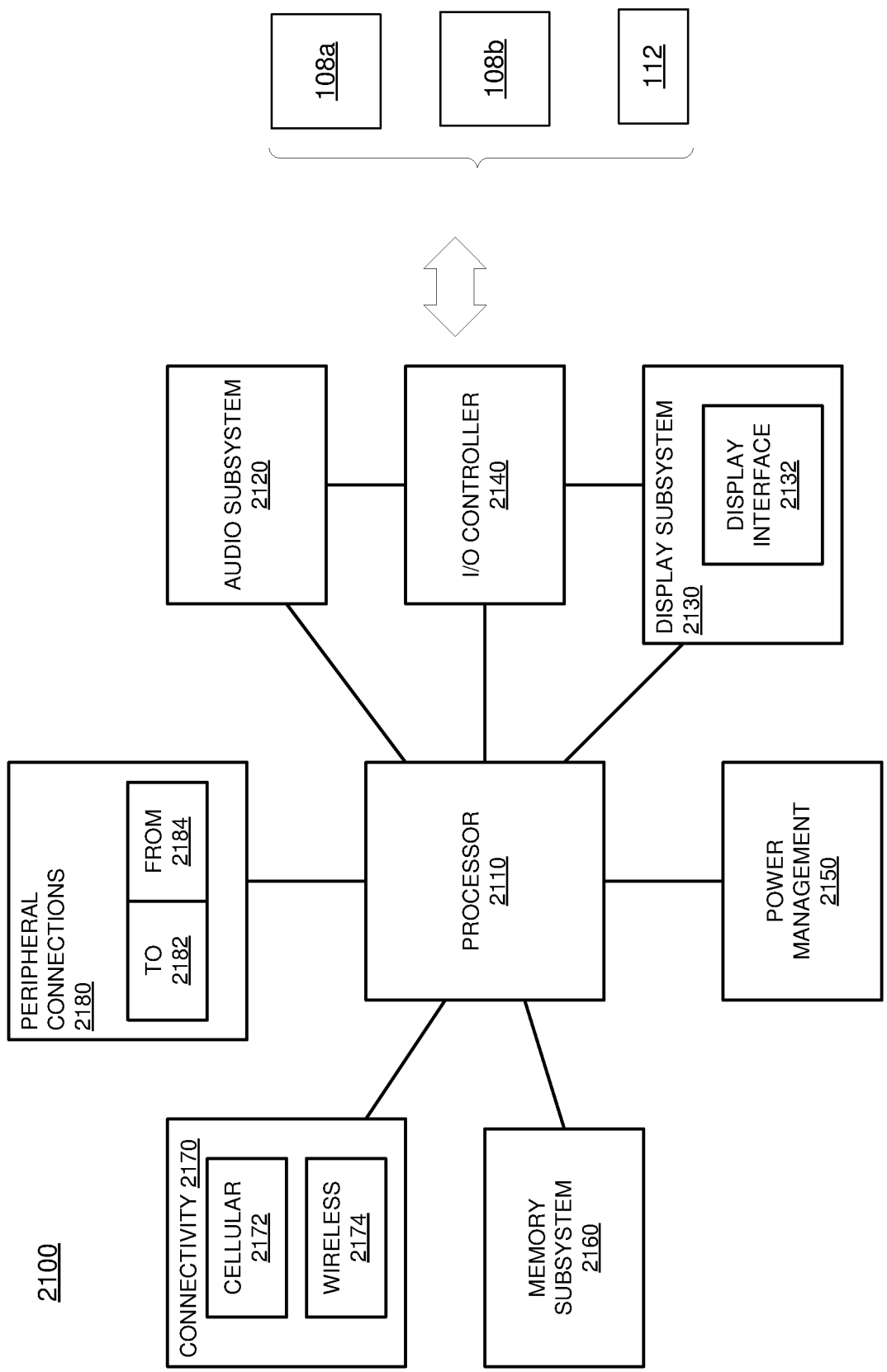
FIG. 10 illustrates a computer system, a computing device or a SoC (System-on-Chip), where various components of the computing device may be grouped in multiple domains, with one or more domains having corresponding one or more domain VRs, and where one or more cross-domain VRs may transfer power between domains, according to some embodiments.

FIG. 10 illustrates a computer system, a computing device or a SoC (System-on-Chip) 2100, where various components of the computing device may be grouped in multiple domains, with one or more domains having corresponding one or more domain VRs, and where one or more cross-domain VRs may transfer power between domains, according to some embodiments. It is pointed out that those elements of FIG. 10 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, various components of the computing device 2100 may be grouped in multiple domains. Merely as an example, a first domain may include one or more of a memory, a processor, or a wireless interface of the computing device 2100, and a second domain may include another one or more of the memory, the processor, or the wireless interface of the computing device 2100. Domain VRs (e.g., VR 108*a*, 108*b*, or other domain VRs discussed herein) may power respective domains. The computing device 2100 may include one or more X-VRs (e.g., X-VR 112, or one or more other X-VRs discussed herein) to transfer power between domains, e.g., as discussed with respect to FIGS. 1-9 of this disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

A semiconductor package comprising: a first domain comprising first one or more circuitries; a second domain comprising second one or more circuitries; a first voltage regulator (VR) to supply power to the first domain from a power bus; a second VR to supply power to the second domain from the power bus; and a third VR coupled between the first and second domains, the third VR to at least one of: transmit power to at least one of the first or second domains, or receive power from at least one of the first or second domains.

Example 2

The semiconductor package of example 1 or any other examples provided herein, further comprising: a substrate; and a first die and a second die stacked on the substrate, wherein the first VR comprises one or more inductors and one or more switches, wherein the first die comprises the first domain and the second domain, and wherein the second die comprises the one or more switches of the first VR.

Example 3

The semiconductor package of example 2 or any other examples provided herein, wherein: the one or more inductors of the first VR are on, or embedded within, the substrate.

Example 4

The semiconductor package of any of examples 2-3 or any other examples provided herein, wherein the one or more inductors of the first VR are first one or more inductors, wherein the one or more switches of the first VR are first one or more switches, and wherein: the third VR comprises second one or more inductors and second one or more switches; the first die comprises the second one or more switches; and the second one or more inductors of the third VR are at least one of: on, or embedded within, the substrate, or on, or embedded within, the second die.

Example 5

The semiconductor package of example 4 or any other examples provided herein, further comprising: a fourth VR comprising third one or more inductors and third one or more switches; and a second power bus, wherein the third VR is coupled between the first domain and the second power bus, wherein the fourth VR is coupled between the second domain and the second power bus, and wherein the first die comprises the third one or more switches of the fourth VR.

Example 6

The semiconductor package of example 5 or any other examples provided herein, wherein the substrate comprises the second power bus.

Example 7

The semiconductor package of any of examples 2-3 or any other examples provided herein, wherein: the substrate has a recess, and a non-recessed section that does not include the recess; the second die is at least in part within the recess; and the first die is stacked on the second die, such that: a first one or more interconnect structures of the first die is coupled to the second die, and a second one or more interconnect structures of the first die is coupled to the non-recessed section of the substrate.

Example 8

The semiconductor package of any of examples 2-3 or any other examples provided herein, wherein: the one or more inductors of the first VR are integrated within the first die or the second die.

Example 9

The semiconductor package of example 1 or any other examples provided herein, further comprising: a fourth VR to receive input power to the apparatus, and supply power to the power bus.

Example 10

The semiconductor package of example 1 or any other examples provided herein, wherein the third VR is to: receive power from the first domain, and transmit power to the second domain, thereby transferring power from the first domain to the second domain.

Example 11

The semiconductor package of example 1 or any other examples provided herein, wherein the power bus is a first power bus, wherein the apparatus further comprises: a fourth VR; and a second power bus, wherein the third VR is coupled between the first domain and the second power bus, and wherein the fourth VR is coupled between the second domain and the second power bus.

Example 12

The semiconductor package of example 11 or any other examples provided herein, wherein: the third VR is to transmit power between the first domain and the second power bus; and the fourth VR is to transmit power between the second domain and the second power bus.

Example 13

The semiconductor package of example 12 or any other examples provided herein, further comprising: a third domain comprising third one or more circuitries, wherein the third domain is to receive power from the second power bus.

Example 14

The semiconductor package of example 1 or any other examples provided herein, further comprising: a fourth VR; and a third domain comprising third one or more circuitries, wherein the third VR is coupled between the first domain and the third domain, wherein the fourth VR is coupled between the second domain and the third domain, and wherein the third domain is to receive power from one or both of: the first domain via the third VR, or the second domain via the fourth VR.

Example 15

The semiconductor package of example 1 or any other examples provided herein, wherein the third VR is to receive power from the power bus via one or both the first or second domains, and wherein the third VR is to refrain from receiving power from the power bus by bypassing the first and second domains.

Example 16

A system comprising: a memory to store instructions; a processor coupled to the memory, the processor to execute the instructions; a wireless interface to facilitate communication between the processor and another system; a first domain comprising one or more of the memory, the processor, or the wireless interface; a second domain comprising another one or more of the memory, the processor, or the wireless interface; a first voltage regulator (VR) to supply power to the first domain from a power bus; a second VR to supply power to the second domain from the power bus; and a third VR coupled between the first and second domains, the third VR to perform at least one of: transmit power to at least one of the first or second domains, or receive power from at least one of the first or second domains.

Example 17

The system of example 16 or any other examples provided herein, further comprising: a substrate; and a first die and a second die stacked on the substrate, wherein the first VR comprises one or more inductors and one or more switches, wherein the first die comprises the first domain and the second domain, and wherein the second die comprises the one or more switches of the first VR.

Example 18

A method comprising: supplying, by a first Direct Current (DC) to DC converter (DC-DC converter), power from a power bus to a first domain, the first domain comprising first one or more circuitries; supplying, by a second DC-DC converter, power from the power bus to a second domain, the second domain comprising second one or more circuitries; and transmitting, by a cross-domain DC-DC converter, power from or to at least one of the first or second domains.

Example 19

The method of example 18 or any other examples provided herein, wherein the cross-domain DC-DC converter is a first cross-domain DC-DC converter, and wherein the method further comprises: transmitting, by a second cross-domain DC-DC converter, power between a common power bus and the second domain, wherein transmitting, by the first cross-domain DC-DC converter, power from or to at least one of the first or second domains comprises: transmitting, by the first cross-domain DC-DC converter, power between the common power bus and the first domain.

Example 20

The method of example 19 or any other examples provided herein, further comprising: transmitting, by a third cross-domain DC-DC converter, power between the common power bus and a third domain.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A semiconductor package comprising:
a first domain comprising first one or more circuitries;
a second domain comprising second one or more circuitries;
a first voltage regulator (VR) to supply power to the first domain from a power bus;
a second VR to supply power to the second domain from the power bus; and
a third VR that couples the first domain to the second domain, the third VR to transmit to the first domain power received from the second domain.

2. The semiconductor package of claim 1, further comprising:
a substrate; and
a first die and a second die on the substrate,
wherein the first VR comprises one or more inductors and one or more switches,
wherein the first die comprises the first domain and the second domain, and
wherein the second die comprises the one or more switches of the first VR.

3. The semiconductor package of claim 2, wherein:
the one or more inductors of the first VR are on, or embedded within, the substrate.

4. The semiconductor package of claim 2, wherein the one or more inductors of the first VR are first one or more inductors, wherein the one or more switches of the first VR are first one or more switches, and wherein:
the third VR comprises second one or more inductors and second one or more switches;
the first die comprises the second one or more switches; and
the second one or more inductors of the third VR are at least one of:
on, or embedded within, the substrate, or
on, or embedded within, the second die.

5. The semiconductor package of claim 4, further comprising:
a fourth VR comprising third one or more inductors and third one or more switches; and
a second power bus,
wherein the third VR couples the first domain to the second power bus,
wherein the fourth VR couples the second domain to the second power bus, and
wherein the first die comprises the third one or more switches of the fourth VR.

6. The semiconductor package of claim 5, wherein the substrate comprises the second power bus.

7. The semiconductor package of claim 2, wherein:
the substrate has a recess, and a non-recessed section that does not include the recess;
the second die is at least in part within the recess; and
the first die is stacked on the second die, such that:
a first one or more interconnect structures of the first die is coupled to the second die, and
a second one or more interconnect structures of the first die is coupled to the non-recessed section of the substrate.

8. The semiconductor package of claim 2, wherein:
the one or more inductors of the first VR are integrated within the first die or the second die.

9. The semiconductor package of claim 1, further comprising:
a fourth VR to receive input power to the apparatus, and supply power to the power bus.

10. The semiconductor package of claim 1, wherein the power bus is a first power bus, wherein the apparatus further comprises:
a fourth VR; and
a second power bus,
wherein the third VR couples the first domain to the second power bus, and
wherein the fourth VR couples the second domain to the second power bus.

11. The semiconductor package of claim 10, wherein:
the third VR is to transmit power from the first domain to the second power bus; and
the fourth VR is to transmit power to the second domain from the second power bus.

12. The semiconductor package of claim 11, further comprising:
a third domain comprising third one or more circuitries,
wherein the third domain is to receive power from the second power bus.

13. The semiconductor package of claim 1, further comprising:
a fourth VR; and
a third domain comprising third one or more circuitries,
wherein the third VR couples the first domain to the third domain,
wherein the fourth VR couples the second domain to the third domain, and wherein the third domain is to receive power from both of:
the first domain via the third VR, and the second domain via the fourth VR.

14. The semiconductor package of claim 1, wherein the third VR is to receive power from the power bus via one or both the first or second domains, and wherein the third VR is to refrain from receiving power from the power bus by bypassing the first and second domains.

15. A system comprising:
a memory to store instructions;
a processor coupled to the memory, the processor to execute the instructions;
a wireless interface to facilitate communication between the processor and another system;
a first domain comprising one or more of the memory, the processor, or the wireless interface;
a second domain comprising another one or more of the memory, the processor, or the wireless interface;
a first voltage regulator (VR) to supply power to the first domain from a power bus;
a second VR to supply power to the second domain from the power bus; and
a third VR that couples the first domain to the second domain, the third VR to transmit to the first domain power received from the second domain.

16. The system of claim 15, further comprising:
a substrate; and
a first die and a second die stacked on the substrate,
wherein the first VR comprises one or more inductors and one or more switches,
wherein the first die comprises the first domain and the second domain, and
wherein the second die comprises the one or more switches of the first VR.

17. A method comprising:
supplying, by a first Direct Current (DC) to DC converter (DC-DC converter), power from a power bus to a first domain, the first domain comprising first one or more circuitries;
supplying, by a second DC-DC converter, power from the power bus to a second domain, the second domain comprising second one or more circuitries; and
transmitting, by a cross-domain DC-DC converter, power received from the second domain to the first domain.

18. The method of claim 17, wherein the cross-domain DC-DC converter is a first cross-domain DC-DC converter, and wherein the method further comprises:
transmitting, by a second cross-domain DC-DC converter, power between a common power bus and the second domain,
wherein transmitting, by the first cross-domain DC-DC converter, power to the first domain comprises:
transmitting, by the first cross-domain DC-DC converter, power between the common power bus and the first domain.

19. The method of claim 18, further comprising:
transmitting, by a third cross-domain DC-DC converter, power between the common power bus and a third domain.

* * * * *